(12) United States Patent
McCallister et al.

(10) Patent No.: US 7,724,840 B2
(45) Date of Patent: May 25, 2010

(54) RF TRANSMITTER WITH PREDISTORTION AND METHOD THEREFOR

(75) Inventors: Ronald Duane McCallister, Scottsdale, AZ (US); Eric M. Brombaugh, Mesa, AZ (US)

(73) Assignee: Crestcom, Inc., Scottsdale, AZ (US)

( * ) Notice: Subject to any disclaimer, the term of this patent is extended or adjusted under 35 U.S.C. 154(b) by 797 days.

(21) Appl. No.: 11/641,914

(22) Filed: Dec. 19, 2006

(65) Prior Publication Data

US 2008/0144709 A1 Jun. 19, 2008

(51) Int. Cl.
*H04L 25/03* (2006.01)
*H04L 27/36* (2006.01)

(52) U.S. Cl. .......... 375/297; 375/232; 330/149

(58) Field of Classification Search .......... 375/232, 375/295, 296, 297; 455/114.1, 114.2, 114.3, 455/126, 67.13, 63.1; 330/149
See application file for complete search history.

(56) References Cited

U.S. PATENT DOCUMENTS

| | | | |
|---|---|---|---|
| 4,053,837 A | 10/1977 | Ryan et al. | |
| 4,085,378 A | 4/1978 | Ryan et al. | |
| 4,270,179 A | 5/1981 | Sifford et al. | |
| 4,290,139 A | 9/1981 | Walsh | |
| 4,422,175 A | 12/1983 | Bingham et al. | |
| 4,633,482 A | 12/1986 | Sari | |
| 4,878,029 A | 10/1989 | Saulnier et al. | |
| 4,888,557 A | 12/1989 | Puckette, IV et al. | |
| 4,902,979 A | 2/1990 | Puckette, IV | |
| 4,910,698 A | 3/1990 | McCartney | |
| 5,049,832 A | 9/1991 | Cavers | |
| 5,105,445 A | 4/1992 | Karam et al. | |
| 5,113,414 A | 5/1992 | Karam et al. | |
| 5,226,060 A | 7/1993 | Goodson et al. | |
| 5,243,624 A | 9/1993 | Paik et al. | |
| 5,454,007 A | 9/1995 | Dutta | |
| 5,559,807 A | 9/1996 | van den Heuvel et al. | |
| 5,721,756 A | 2/1998 | Liebetreu et al. | |

(Continued)

FOREIGN PATENT DOCUMENTS

EP   1 318 643 A1   6/2003

OTHER PUBLICATIONS

Morgan, MA, "Reducing Measurement Notice Effects in Digital Predistortion of RF Power Amplifiers", Bell Laboratories, IEEE 2003.

(Continued)

*Primary Examiner*—Betsy L Deppe
(74) *Attorney, Agent, or Firm*—Meschkow & Gresham, P.L.C.

(57) ABSTRACT

An RF transmitter (10) includes a linear predistorter (22) and a nonlinear predistorter (24) which together drive analog transmitter components (14). The linear and nonlinear predistorters (22, 24) are implemented using a collection of adaptive equalizers (30). A feedback signal (20) is developed by downconverting an RF communication signal (16) obtained from the analog components (14). The feedback signal (20) are used in driving tap coefficients (34) for the adaptive equalizers (30', 30") in the nonlinear predistorter (24). An intermodulation-product canceller (94) uses signal cancellation to cancel intermodulation products from the feedback signal (20) and generate an intermodulation-neutralized feedback signal (96). The intermodulation-neutralized feedback signal (96) is used along with a modulated convergence factor (43) in driving tap coefficients (34) for the adaptive equalizer (30) in the linear predistorter (22).

40 Claims, 5 Drawing Sheets

U.S. PATENT DOCUMENTS

| | | | |
|---|---|---|---|
| 5,732,333 | A | 3/1998 | Cox et al. |
| 5,745,597 | A | 4/1998 | Agazzi et al. |
| 5,760,646 | A | 6/1998 | Belcher et al. |
| 5,778,029 | A | 7/1998 | Kaufmann |
| 5,790,527 | A | 8/1998 | Janky et al. |
| 5,819,165 | A | 10/1998 | Hulkko et al. |
| 5,867,065 | A | 2/1999 | Leyendecker |
| 5,903,823 | A | 5/1999 | Moriyama et al. |
| 5,923,712 | A | 7/1999 | Leyendecker et al. |
| 5,949,832 | A | 9/1999 | Liebetreu et al. |
| 6,081,158 | A | 6/2000 | Twitchell et al. |
| 6,112,059 | A | 8/2000 | Schwent et al. |
| 6,118,335 | A | 9/2000 | Nielsen et al. |
| 6,125,266 | A | 9/2000 | Matero et al. |
| 6,141,390 | A | 10/2000 | Cova |
| 6,166,601 | A | 12/2000 | Shalom et al. |
| 6,222,878 | B1 | 4/2001 | McCallister et al. |
| 6,236,837 | B1 | 5/2001 | Midya |
| 6,240,278 | B1 | 5/2001 | Midya et al. |
| 6,281,936 | B1 | 8/2001 | Twitchell et al. |
| 6,282,247 | B1 | 8/2001 | Shen |
| 6,285,412 | B1 | 9/2001 | Twitchell |
| 6,298,097 | B1 | 10/2001 | Shalom |
| 6,335,767 | B1 | 1/2002 | Twitchell et al. |
| 6,442,217 | B1 | 8/2002 | Cochran |
| 6,507,731 | B1 | 1/2003 | Hasegawa |
| 6,512,800 | B1 | 1/2003 | Amir et al. |
| 6,515,712 | B1 | 2/2003 | Jeong |
| 6,600,516 | B1 | 7/2003 | Danielsons et al. |
| 6,775,330 | B2 | 8/2004 | Bach et al. |
| 6,794,939 | B2 | 9/2004 | Kim et al. |
| 6,819,720 | B1 | 11/2004 | Willettes |
| 2001/0005402 | A1 | 6/2001 | Nagatani et al. |
| 2002/0064236 | A1 | 5/2002 | Matsuoka et al. |
| 2002/0180523 | A1 | 12/2002 | Okubo et al. |
| 2002/0193078 | A1 | 12/2002 | Shearer, III et al. |
| 2003/0020538 | A1 | 1/2003 | Kim |
| 2003/0058959 | A1 | 3/2003 | Rafie et al. |
| 2003/0063682 | A1 | 4/2003 | Shearer, III |
| 2003/0063683 | A1 | 4/2003 | Shearer, III et al. |
| 2003/0076894 | A1 | 4/2003 | Jin et al. |
| 2003/0078074 | A1 | 4/2003 | Sesay et al. |
| 2003/0123568 | A1 | 7/2003 | Ophir et al. |
| 2003/0146787 | A1 | 8/2003 | Hedberg et al. |
| 2003/0156658 | A1 | 8/2003 | Dartois |
| 2003/0179831 | A1 | 9/2003 | Gupta et al. |
| 2003/0223508 | A1 | 12/2003 | Ding et al. |
| 2003/0227981 | A1 | 12/2003 | Vella-Coleiro et al. |
| 2004/0013206 | A1 | 1/2004 | Gamm et al. |
| 2004/0021517 | A1 | 2/2004 | Irvine et al. |
| 2004/0116083 | A1* | 6/2004 | Suzuki et al. ............... 455/126 |
| 2004/0164791 | A1 | 8/2004 | Bartuni |
| 2004/0208242 | A1 | 10/2004 | Bartuni |
| 2005/0101269 | A1 | 5/2005 | Dale et al. |
| 2005/0111575 | A1* | 5/2005 | Taler et al. ................. 375/297 |
| 2005/0123066 | A1 | 6/2005 | Sarca |
| 2005/0152476 | A1 | 7/2005 | Coersmeier |
| 2005/0163205 | A1 | 7/2005 | McCallister |
| 2005/0163208 | A1 | 7/2005 | McCallister |
| 2005/0163249 | A1 | 7/2005 | McCallister |
| 2005/0163250 | A1 | 7/2005 | McCallister |
| 2005/0163251 | A1 | 7/2005 | McCallister |
| 2005/0163252 | A1 | 7/2005 | McCallister |
| 2005/0163268 | A1 | 7/2005 | McCallister |
| 2005/0189990 | A1* | 9/2005 | Mizuta et al. ............... 330/149 |
| 2006/0078065 | A1* | 4/2006 | Cai et al. ................... 375/297 |
| 2007/0133713 | A1* | 6/2007 | Dalipi ........................ 375/297 |

OTHER PUBLICATIONS

Santamaria, Ibanez, Lazaro, Pantaleon, Vielva, "Modeling Nonlinear Power Amplifiers in OFDM Systems from Subsampled Data: A Comparative Study Using Real Measurements" 2003.

Ibanez-Diaz, Pantaleon, Santamaria, Fernandez, Martinez, "Nonlinear Estimation in Power Amplifiers Based on Subsampled Temporal Data", IEEE 2001.

Eun, Powers, "A New Volterra Predistortion Based on the Idirect Learning Architecture", IEEE Transaction of Signal Processing, 1997 IEEE.

Edmund Coersmeier, Ernst Zielinski, Frequency Selective IQ Phrase and IQ Amplitude Imbalance Adjustments for OFDM Direct Conversion Transmitters, Mar. 2003.

Ding, Raich, & Zhou "A Hammerstein Predistortion Linearization Design Based on the Indirect Learning Architecture" Georgia Inst. of Tech. School of Elect. & Comp. Engineering. ICASSP '02, vol. 3, p. 2689-2692, May 2002.

Cavers, "The Effect of Quadrature Modulator and Demodulator Errors on Adaptive Digital Predistorters for Amplifer Lienearization" IEEE Trans on Vech Tech, vol. 46, #2, May 1997, p. 456-466.

Ding & Zhou. "Effects of Even-order Nonlinear Terms on Power Amplifier Modeling and Predistortion Linearization" IEEE Transactions on Vehicular Technology, Aug. 2002, p. 1-14.

Ohlsson, "Studies on Implementation of Digital Filters With High Throughput and Low Power Consumption" Institute of Technology, Dept of Electrical Engineering, p. 61-73, Jun. 2003.

Raich, Qian & Zhou, "Digital Baseband Predistortion of Nonlinear Power Amplifiers Using Orthgonal Polynominals" Proc. ICASSP, 2003, p. 689-692, Hong Kong China, Apr. 2003.

Godavarti "Multiple Antennas in Wireless Communications" Array Signal Processing and Channel Capacity, University of Michigan, p. 16-52, 2001.

"Pact Application Note: Adaptive Filter Based on the LMS-Algorithm".

Choo "Mapping LMS Adaptive Filter IP Core to Multiplier-Array FPGA Architecture for High Channel-Density VOIP Line Echo Cancellation" CMP United Business Media, 2003.

Widrow, McCool & Ball, "The Complex LMS Algorithm" Information Systems Laboratory, Nava Undersea Center, Fleet Engineering Dept, Aug. 19, 1974, p. 719-720.

Park, Woo, Raich, Kenney, Zhou, "Adaptive Predistortion Linearization of RF Power Amplifiers Using Lookup Tableg Generated from Subsampled Data", IEEE 2002, p. 233-236.

* cited by examiner

RF TRANSMITTER WITH PREDISTORTION AND METHOD THEREFOR

RELATED INVENTIONS

This patent is related to "Transmitter Predistortion Circuit and Method Therefor," by the inventors of this patent, Ser. No. 11/012,427, filed 14 Dec. 2004, which is a continuation-in-part of "Predistortion Circuit and Method for Compensating A/D and Other Distortion in a Digital RF Communications Transmitter," by an inventor of this patent, Ser. No. 10/840,735, filed 6 May 2004, which is a continuation-in-part of "A Distortion-Managed Digital RF Communications Transmitter and Method Therefor" by an inventor of this patent, filed 27 Jan. 2004, Ser. No. 10/766,801, each of which is incorporated herein by reference.

This patent is also related to "Equalized Signal Path with Predictive Subtraction Signal and Method Therefor" (Ser. No. 10/971,628, filed 22 Oct. 2004), "Predistortion Circuit and Method for Compensating Linear Distortion in a Digital RF Communications Transmitter" (Ser. No. 10/766,768, filed 27 Jan. 2004), and to "Predistortion Circuit and Method for Compensating Nonlinear Distortion in a Digital RF Communications Transmitter" (Ser. No. 10/766,779, filed 27 Jan. 2004), each invented by an inventor of this patent, and each of which is incorporated herein by reference.

TECHNICAL FIELD OF THE INVENTION

The present invention relates generally to the field of radio-frequency (RF) communications. More specifically, the present invention relates to the use of predistortion in an RF transmitter to reduce inaccuracies introduced by analog components.

BACKGROUND OF THE INVENTION

RF transmitters that attempt to provide linear amplification may suffer from a variety of signal distortions. In such applications, real-world RF amplifiers fail to provide perfectly linear amplification, causing spectral regrowth to occur. Since modern regulations place strict limitations on the amount of spectral regrowth that may be tolerated, any signal distortion resulting from nonlinear amplification poses a serious problem for RF transmitter designs. In addition, any linear distortion in the transmitted RF communication signal is undesirable because linear distortion must be overcome in a receiver, often by necessitating transmission at greater power levels than would otherwise be required. Linear distortions also complicate the spectral regrowth problem.

A variety of well known RF power amplifier and other analog component design techniques may be employed to ensure that nonlinear amplification and other forms of distortion are held to a minimum. But as such techniques get more exotic, the analog component costs increase, and often increase dramatically. Accordingly, predistortion may be a desirable alternative to the use of exotic and expensive analog components, such as highly linearized RF power amplifiers.

Digital predistortion has been applied to digital communication signals prior to signal processing in analog components to permit the use of less expensive power amplifiers and also to improve the performance of more expensive power amplifiers. Digital predistortion refers to digital processing applied to a communication signal while it is still in its digital form, prior to analog conversion. The digital processing attempts to distort the digital communications signal in precisely the right way so that after inaccuracies are applied by linear amplification and other analog processing, the resulting transmitted RF communications signal exhibits negligible residual distortion. To the extent that amplifier nonlinearity is corrected through digital predistortion, lower-power, less-expensive amplifiers may be used, the amplifiers may be operated at their more-efficient, lower-backoff operating ranges, and spectral regrowth is reduced. And, since the digital predistortion is performed through digital processing, it should be able to implement whatever distortion functions it is instructed to implement in an extremely precise manner and at reasonable cost.

The more effective predistortion techniques obtain knowledge of the way in which analog components distort the communications signal in order to craft the proper predistortion-transfer functions that will compensate for distortion introduced by the analog components. A predistortion technique that is disclosed in the above-listed Related Inventions section hereof uses a collection of adaptive equalizers to determine, implement, and continuously or repeatedly revise such predistortion-transfer functions. One adaptive equalizer filters a baseband communication signal, while other adaptive equalizers filter "basis functions" that are functionally related to the baseband communication signal raised to various powers. Each of the predistortion adaptive equalizers has tap coefficients that define how to predistort the baseband communication signal or basis functions. The tap coefficients are adjusted in response to a feedback signal which provides knowledge about the way in which the analog components are distorting the communication signal at each instant. As a result, feedback loops are formed and tap coefficients are continuously or repeatedly adjusted so that spectral regrowth and linear distortion are minimized.

This prior technique taught that tap coefficients are adjusted through the use of a type of Least Mean Square (LMS) algorithm. For the linear adaptive equalizer that filters the baseband communication signal, the LMS algorithm generally identified correlation between the baseband communication signal and an error signal formed in response to the feedback signal. The correlation function was implemented by a long sequence of mathematical multiplications. The sequence of multiplications was integrated, and the integration results were used in forming tap coefficients. The integration operations caused tap coefficients to adjust until steady-state integrator values were reached where distortions in the in-band portion of the communication signal were minimized, and then to track any changes.

But the feedback signal also includes components other than a distorted version of the original baseband communication signal. To the extent that the feedback signal includes noise or other components that do not correlate with the baseband communication signal, the tap coefficients are not affected. But some of the other components are intermodulation products, albeit at low residual levels due to the operation of nonlinear predistortion. And, a portion of the intermodulation products may be slightly correlated to the baseband communication signal because this signal is the source of some of the intermodulation products as it is upconverted and passed through a nonlinear device, such as an imperfectly linear power amplifier. Correlation between the baseband communication signal and such intermodulation products cause tap coefficients to be less accurate then they could be, although any inaccuracy is usually at a very low level.

On some occasions, however, a regenerative feedback loop can potentially form. Generally, tap coefficients in the adaptive equalizer that serves as the linear predistorter may adapt in a direction that can reduce linear distortion, but in so adapting also worsen those correlated intermodulation products that are present at a low level in the feedback signal.

When this happens, the adaptive equalizer may be insufficiently effective at reducing linear distortion because of the interference caused by correlated intermodulation products in the tap adjustment algorithm. And, in rare situations, adapting tap coefficients to address linear distortion might possibly worsen those correlated intermodulation products that are present at a low level in the feedback signal to a greater extent than the linear distortion is reduced. In this scenario, an unstable feedback loop would result, causing undesirable distortions to appear in the transmitted RF communication signal.

SUMMARY OF THE INVENTION

It is an advantage of at least one embodiment of the present invention that an improved RF transmitter with predistortion and a method therefor are provided.

Another advantage of at least one embodiment of the present invention is that a feedback loop is prevented from becoming inaccurate and possibly unstable at least in part because intermodulation products are attenuated in a feedback signal used by an RF transmitter to adjust tap coefficients in an adaptive equalizer that serves as a linear predistorter.

Another advantage of at least one embodiment of the present invention is that signal cancellation is used to remove intermodulation products from a feedback signal.

Another advantage of at least one embodiment of the present invention is that a baseline communication signal is used to form an intermodulation-estimate signal that, when combined with a feedback signal, cancels an intermodulation product.

Another advantage of at least one embodiment of the present invention is that a nonlinear predistorter adjusts tap coefficients in response to intermodulation products but a linear predistorter is insensitive to intermodulation products.

These and other advantages are realized in one form by an RF transmitter with predistortion. The RF transmitter includes an adaptive equalizer configured to predistort a baseline communication signal into a predistorted communication signal and to adjust tap coefficients of the adaptive equalizer. The tap coefficients define how to predistort the baseline communication signal. A power amplifier is located downstream of the adaptive equalizer and is configured to generate an RF communication signal which carries a residually distorted communication signal and intermodulation products thereof. A feedback signal generator is configured to generate a feedback signal in response to the RF communication signal. The feedback signal is characterized by the residually distorted communication signal in combination with one or more of the intermodulation products. An intermodulation-product canceller is adapted to generate an intermodulation-neutralized-feedback signal from the feedback signal. The intermodulation-neutralized-feedback signal is supplied to the adaptive equalizer so that its tap coefficients adapt in response to the intermodulation-neutralized-feedback signal.

The above and other advantages are realized in another form by a method of operating an RF transmitter. The method calls for filtering a baseline communication signal in an adaptive equalizer having adaptable tap coefficients to form a predistorted communication signal. An intermodulation-neutralized-feedback signal from which intermodulation products have been cancelled is produced. And, the tap coefficients are adjusted in response to the intermodulation-neutralized-feedback signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
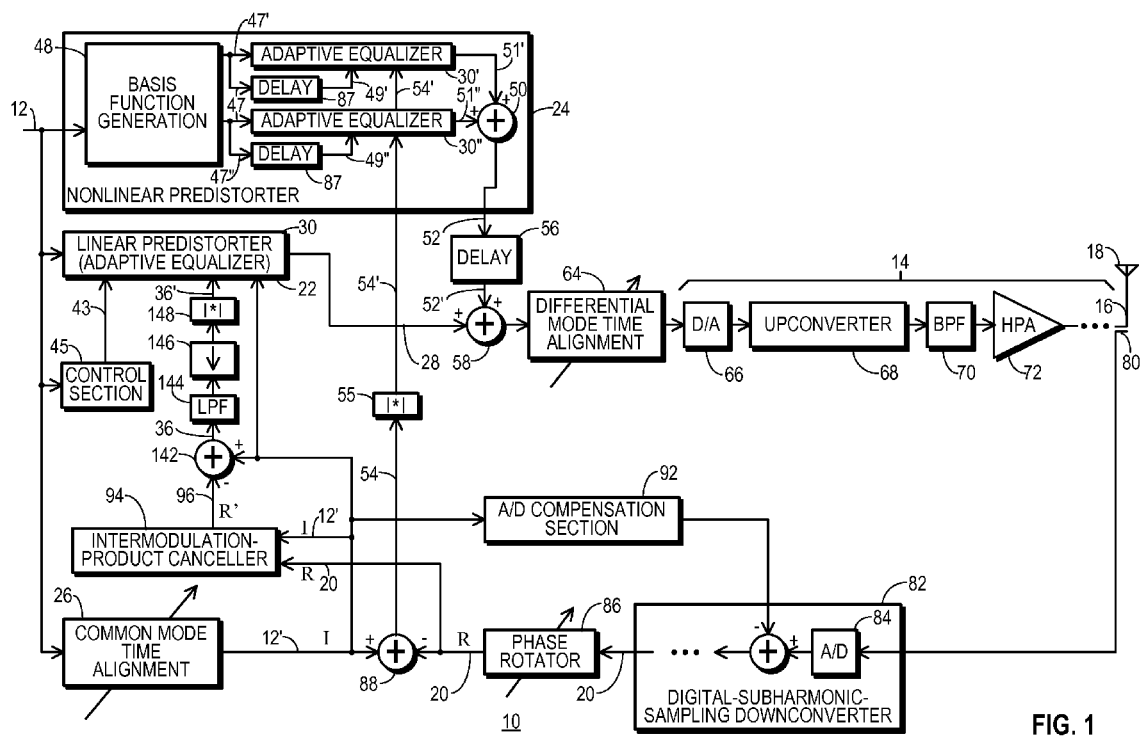
FIG. 1 shows a block diagram of an RF transmitter configured in accordance with one embodiment of the present invention.

FIG. 1 shows a block diagram of an RF transmitter 10 configured in accordance with one embodiment of the present invention. RF transmitter 10 is adapted to receive a baseline communication signal 12.

Figure 2:
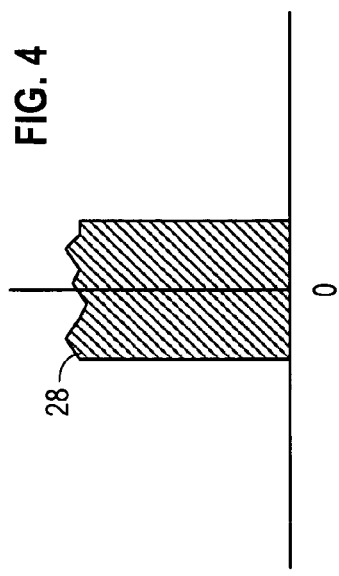
FIG. 2 graphically shows a spectral representation of a baseline communication signal produced in the RF transmitter of FIG. 1.

FIG. 2 graphically shows a spectral representation of baseline communication signal 12. Referring to FIGS. 1 and 2, in the preferred embodiment, baseline communication signal 12 is a complex digital signal having in-phase and quadrature components, preferably frequency-located at baseband. Hence, FIG. 2 depicts baseline communication signal 12 located at a frequency of zero, but this is not a requirement of the present invention.

As received at transmitter 10, baseline communication signal 12 has been digitally modulated to convey any and all data to be communicated by RF transmitter 10, using any of a wide variety of digital modulation techniques known to those skilled in the art. In addition, pulse-shape filtering may have been applied to reduce intersymbol interference in a manner known to those skilled in the art, signal peaks may have been limited to reduce a peak-to-average power ratio (PAPR), and other signal processing tasks may have been performed to produce baseline communication signal 12. Even though upstream tasks may have affected the spectral characteristics of baseline communication signal 12, for the purposes of RF transmitter 10, baseline communication signal 12 is deemed to be an undistorted signal. In other words, baseline communication signal 12 is treated as an "ideal" signal, and subsequent distortions in the communication signal are viewed as deviations from the ideal. The purported "ideal" nature of baseline communication signal 12 is represented in FIG. 2 by the perfectly flat top and perfectly vertical sides for the spectrum of baseline communication signal 12. Those skilled in the art will appreciate that the terms "ideal" and "undistorted" are used herein to denote a reference point from which subsequent processing takes place and pose no limitation on the invention described and claimed herein.

In general, RF transmitter 10 predistorts baseline communication signal 12 to compensate for distortions introduced downstream of the predistortion in analog transmitter components 14. Analog transmitter components 14 convert the predistorted version of the communication signal into an RF communication signal 16, which is subsequently broadcast from an antenna 18. But a portion of the communication signal 16 is converted into a feedback signal 20 which controls the nature of the predistortion applied to baseline communication signal 12.

Baseline communication signal 12 drives a linear predistorter 22, a nonlinear predistorter 24, and a common mode time alignment block 26. Linear predistorter 22 filters baseline communication signal 12 to produce a predistorted communication signal 28. In a preferred embodiment, an adaptive equalizer 30 is configured to serve as linear predistorter 22.

Figure 3:
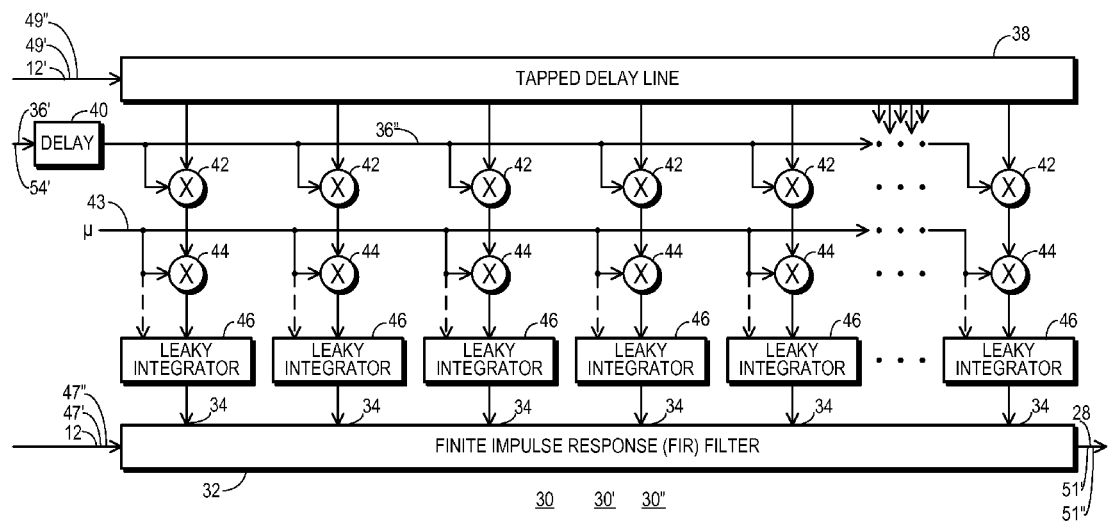
FIG. 3 shows a simplified block diagram of an adaptive equalizer that may be used in implementing the RF transmitter of FIG. 1.

FIG. 3 shows a simplified block diagram of adaptive equalizer 30. Adaptive equalizer 30 includes a finite impulse response (FIR) filter 32 which receives baseline communication signal 12 at a data input of filter 32 and filters baseline communication signal 12 so that predistorted communication signal 28 is produced at a data output of filter 32.

Figure 4:
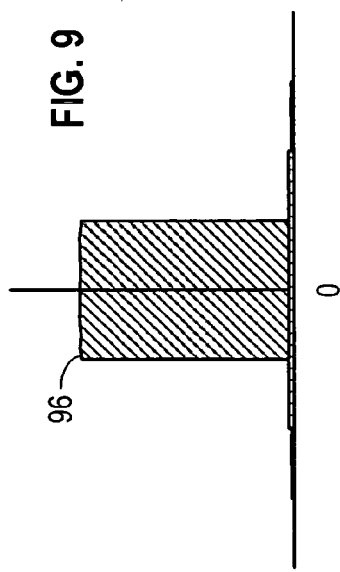
FIG. 4 graphically shows a spectral representation of a predistorted communication signal produced in the RF transmitter of FIG. 1.

FIG. 4 graphically shows a spectral representation of predistorted communication signal 28. The uneven amplitude of signal 28 over its bandwidth indicates that the "ideal" nature of baseline communication signal 12 has now been distorted. But the bandwidth of predistorted communication signal 28 remains substantially the same as the bandwidth of baseline communication signal 12.

For the purposes of simplification, FIG. 3 depicts only a "real-signal" implementation of filter 32 and adaptive equalizer 30. But those skilled in the art will appreciate that adaptive equalizer 30 preferably processes complex signals and that a "complex-signal" implementation, which is well understood by those skilled in the art, is preferred. The nature of the filtering applied by filter 32 is defined by tap coefficients 34 provided at control inputs to filter 32. Adaptive equalizer 30 may be implemented to accommodate any number of tap coefficients 34. And, a generous number of taps is contemplated in connection with adaptive equalizer 30 when configured for use as linear predistorter 22. But for purposes of comparison, adaptive equalizer 30 may also be configured for inclusion within nonlinear predistorter 24, and in that application far fewer taps are contemplated.

In adaptive equalizer 30, tap coefficients 34 are adaptable. In other words, tap coefficients 34 are either continuously or repeatedly adjusted so that the definition that specifies how to predistort baseline communication signal 12 tracks changes in RF transmitter 10 and baseline communication signal 12. In a preferred embodiment, tap coefficients 34 adapt in response to a Least Mean Square (LMS) algorithm, and also to a leaky-tap update algorithm. Tap coefficients 34 adapt in response to baseline communication signal 12, and more particularly to a form 12' of baseline communication signal 12 that has been delayed. In addition, tap coefficients 34 adapt in response to an error signal 36, which is formed from feedback signal 20 (FIG. 1), and more particularly from a difference between feedback signal 20 and baseline signal 12, and is discussed in more detail below.

Baseline communication signal 12' drives a tapped delay line 38 having roughly the same number of taps as FIR filter 32. Error signal 36, preferably in a conjugate form 36', is delayed in a delay element 40 that preferably postpones error signal 36' for about one-half of the total delay of tapped delay line 38. The taps from tapped delay line 38 drive first inputs of multipliers 42, and a delayed error signal 36" output from delay element 40 drives second inputs of all multipliers 42. Prior to application at adaptive equalizer 30, error signal 36' has been aligned so that it has substantially the same timing as baseline communication signal 12', so delayed error signal 36" is aligned in time approximately at the center of filter 32 and tapped delay line 38. At the various taps of adaptive equalizer 30, multipliers 42 determine correlation between error signal 36' and baseline communication signal 12 on a cycle by cycle basis. Thus, tap coefficients 34 adapt in response to a product of baseline communication signal 12 and error signal 36.

Outputs from multipliers 42 are provided to first inputs of corresponding multipliers 44, and a convergence factor 43 "μ" drives second inputs of all multipliers 44. Convergence factor 43 is set to achieve as rapid a loop convergence as practical without experiencing undue jitter. In one embodiment, convergence factor 43 is initially set at a faster convergence/higher jitter setting when RF transmitter 10 is first initialized, then adjusted toward a slower convergence/lower jitter setting as RF transmitter 10 becomes operational.

In one embodiment, a control section 45 receives an input from baseline communication signal 12 and modulates convergence factor 43 in response to the amplitude of baseline communication signal 12. This embodiment is discussed below in more detail in connection with FIG. 10.

Corresponding outputs from multipliers 44 are provided to leaky integrators 46. Those skilled in the art will appreciate that integrators 46 are made "leaky" by, for example, subtracting a small but easily obtained offset, such as one sixty-fourth or one two-hundred-fifty-sixth, of the integrator output from the integrator input during each clock cycle. The use of leaky integrators 46 causes tap coefficients 34 to adapt in accordance with a leaky-tap LMS algorithm. The leaky-tap LMS algorithm causes the predistortion imparted to baseline communication signal 12 to be very slightly less perfect than would be the result if no leaky-tap algorithm were used. But the leaky-tap algorithm reduces the already low likelihood of predistortion error and loop instability.

Accordingly, positive or negative correlation between baseline communication signal 12' and conjugate error signal 36' causes tap coefficients 34 to drift to a value that, after operation of a feedback loop discussed herein, leads to a reduction in such correlation.

Referring back to FIG. 1, nonlinear predistorter 24 desirably generates a plurality of higher-order basis functions 47 at a basis function generation section 48 in response to baseline communication signal 12. Basis functions 47 are functionally related to baseline communication signal 12 squared, cubed, and so on. Baseline communication signal 12 may be up-sampled using interpolators or the like (not shown) to a sample rate compatible with the higher bandwidth of the basis functions. In the preferred embodiment, basis functions 47 are as orthogonal to each other as is reasonably possible, but this is not a requirement. Orthogonality may be achieved, for example, in accordance with a well known Gram-Schmidt orthogonalization technique. Moreover, in the preferred embodiment only a second-order basis function 47' and a third-order basis function 47" are generated in section 48, but this is not a requirement either.

Nonlinear predistorter 24 desirably equalizes basis functions 47 through independent adaptive equalizers 30' and 30", then combines the equalized basis functions 51' and 51" at an adder 50 into a nonlinear distortion cancellation signal 52. Adaptive equalizers 30' and 30" are desirably configured substantially as discussed above in connection with FIG. 3. But fewer taps may be included for equalizers 30' and 30". And, adaptive equalizers 30' and 30" desirably operate at a higher clock rate to accommodate the higher bandwidth of basis functions 47, when compared to the bandwidth of baseline communication signal 12. Tap coefficients 34 (FIG. 3) for adaptive equalizers 30' and 30" adapt in response to their respective basis function 47 and an error signal 54, and preferably a conjugated version 54' of error signal 54. Like error signal 36 discussed above in connection with adaptive equalizer 30, error signal 54 is responsive to feedback signal 20 and a delayed version of baseline communication signal 12. Any of the LMS error signals 36 or 54' may receive additional processing (discussed below for the linear equalizer) to attenuate specific intermodulation products which might otherwise cause undesirable biases to occur in any of the subject equalizers.

Nonlinear distortion cancellation signal 52 is delayed in a delay element 56, then a delayed version 52' of nonlinear distortion cancellation signal 52, is combined with predistorted communication signal 28 in a combination circuit 58. Delay element 56 delays nonlinear distortion cancellation signal 52 so that the amount of delay experienced by baseline communication signal 12 through nonlinear predistorter 24 and delay element 56 equals the delay experienced through linear predistorter 22. Although not shown, predistorted communication signal 28 is desirably up-sampled to match the sample rate of nonlinear distortion cancellation signal 52 signal 52 prior to combination in combination circuit 58.

In one of many alternate embodiments to the above-described architecture, unlike the architecture depicted in FIG. 1 basis functions may be combined with baseline communication signal 12, then the resulting combination filtered in linear predistorter 22. But this alternate embodiment requires operating linear predistorter 22 at a higher sample rate.

Figure 5:
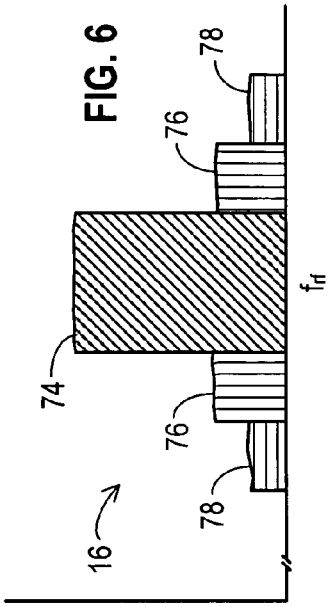
FIG. 5 graphically shows a spectral representation of the predistorted communication signal of FIG. 4 combined with basis functions.

FIG. 5 graphically shows a spectral representation of predistorted communication signal 28 combined with delayed nonlinear distortion cancellation signal 52'. In particular, FIG. 5 depicts delayed nonlinear distortion cancellation signal 52' as including a second-order basis function 60 and a third-order basis function 62. As suggested by the uneven amplitudes over the bandwidths of basis functions 60 and 62, distortions have been introduced through filtering in adaptive equalizers 30' and 30". And, the overall bandwidth of the combined resultant signal has expanded to that of the highest ordered basis function 62. Those skilled in the art will appreciate that FIG. 5 exaggerates the relative amplitudes for the purpose of teaching aspects of RF transmitter 10 that are relevant to the present invention. Most likely, predistorted communication signal 28 will exhibit a much greater relative amplitude when compared to basis functions 60 and 62 than FIG. 5 suggests.

Delayed nonlinear distortion cancellation signal 52' combines an "inverse" nonlinear distortion with linearly predistorted communication signal 28. The amount and form of inverse nonlinear distortion applied at combination circuit 58 is roughly configured to be the inverse of the nonlinear distortions RF communication signal 16 will encounter downstream so that the downstream distortions will cancel the inverse distortion applied at combination circuit 58, resulting in less distortion in the broadcast version of RF communication signal 16 than would result without the operation at combination circuit 58. More precisely, the feedback loops used to define the predistortion result in distorted basis functions 47 that, after regenerating into an even more spectrally rich signal mixture by being processed through partially nonlinear analog components 14, lead to cancellation in RF communication signal 16.

After being combined in combining circuit 58, the combined communication signal passes through a variable, differential-mode, time alignment section 64. Differential time alignment refers to relative delay inserted into one of the in-phase and quadrature-phase legs of the complex communication signal in order to compensate for the likelihood of different delays in the in-phase and quadrature signal paths between digital-to-analog conversions and direct upconversion, which occur downstream. Section 64 may be implemented using a fixed delay of less than one clock interval in one of the legs of the complex communication signal and an interpolator in the other.

After differential timing adjustment in section 64, the communication signal passes to analog transmitter components 14. Analog transmitter components 14 include separate digital-to-analog (D/A) converters 66 for each leg of the complex communication signal. D/A's 66 convert the complex communication signal from digital to analog signals. Subsequent processing of the communication signal will now be analog processing and subject to the inaccuracies characteristic of analog processing. For example, the two different D/A's 66 may not exhibit precisely the same gain and may introduce slightly different amounts of delay. Such differences in gain and delay can lead to linear distortion in RF communication signal 16. Moreover, so long as the different legs of the complex signal are processed separately in different analog components, the components are likely to apply slightly different frequency responses so that linear distortion is worsened by the introduction of frequency-dependent gain and phase imbalances. And, the frequency-dependent gain and phase imbalances worsen as the bandwidth of the communication signal widens.

The two complex legs of the analog communication signal pass from D/A's 66 to two low-pass filters (not shown), which can be the source of additional linear distortion by applying slightly different gains and phase shifts in addition to slightly different frequency-dependent characteristics. Then, the two complex legs pass to an upconverter 68. Upconverter 68 mixes the two complex legs with a local-oscillator signal (not shown) in a manner known to those skilled in the art. Additional linear-distortion in the form of gain and phase imbalance may be introduced, and local-oscillator leakage may produce an unwanted DC offset. In addition, upconverter 68 combines the two distinct legs of the complex signal and passes the combined signal to a band-pass filter (BPF) 70.

BPF 70 is configured to block unwanted sidebands in the upconverted communication signal, but will also introduce additional distortion. The communication signal then passes from BPF 70 to a high-power RF amplifier (HPA) 72. HPA 72 is likely to be the source of a variety of linear and nonlinear distortions introduced into RF communication signal 16. In accordance with a Wiener-Hammerstein RF-amplifier model, HPA 72 acts like an input band-pass filter, followed by a memoryless nonlinearity, which is followed by an output band-pass filter. The memoryless nonlinearity generates an output signal that may be a higher-order complex polynomial function of its input. Each of input and output bandpass filters may introduce linear distortion, but probably little significant nonlinear distortion. On the other hand, the memoryless nonlinearity is a significant source of nonlinear distortion.

RF communication signal 16 then passes from HPA 72 through other analog components, which may include additional filtering, a duplexer, transmission lines, and the like, where additional distortions may be introduced. Eventually, RF communication signal 16 is broadcast from RF transmitter 10 at antenna 18.

Figure 6:
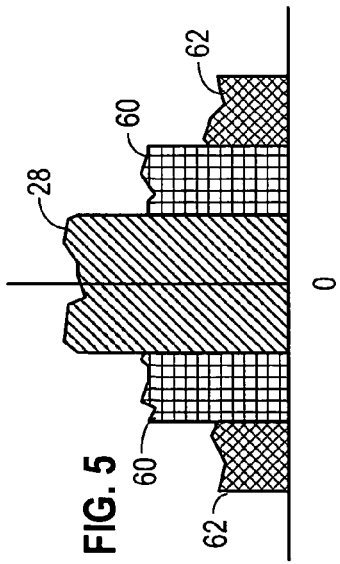
FIG. 6 graphically shows a spectral representation of an RF communication signal produced in the RF transmitter of FIG. 1.

FIG. 6 graphically shows a spectral representation of RF communication signal 16. RF communication signal 16 carries a variety of different components. Predistorted communication 28 has been transformed into a residually distorted communication signal 74 component of RF communication signal 16. Residually distorted communication signal 74 has substantially the same bandwidth as baseline communication signal 12 and predistorted communication signal 28, but is centered at an RF frequency $f_{rf}$. The in-band distortion introduced by linear predistorter 22 has, to a large degree, counteracted the linear distortions introduced in analog transmitter components 14. Consequently, residually distorted communication signal 74 nearly resembles baseline communication signal 16, but some small residual amount of linear distortion remains.

Third order and fifth order intermodulation products 76 and 78, respectively, represent two other components carried by RF communication signal 16. As linearly predistorted communication signal 28 passes through a nonlinear device, such as an imperfectly linear HPA 72, it generates harmonics of each frequency present in the passband. Each harmonic in turn consists of a specific set of intermodulation products. Those skilled in the art will appreciate that the mixing that is responsible for the intermodulation products produces sum and difference components for all combinations of pairs of mixing frequencies. Many intermodulation products, including all even intermodulation products, fall far in frequency from $f_{rf}$ and pose no problem because they are easily filtered off, to the extent that they are realized at all. But certain combinations of sum and difference components for odd ordered intermodulation products fall near $f_{rf}$. In particular, third order intermodulation products 76 result from the difference components from the mixing of second harmonics of residually distorted communication signal 74 with their fundamentals. Fifth order intermodulation products 78 result from the difference components from the mixing of second harmonics of residually distorted communication signal 74 with the third harmonics. Both of third and fifth order intermodulation products 76 and 78 occupy the passband of residually distorted communication signal 74 as well as additional spectrum on either side. The amplitude of third order intermodulation product 76 is larger than for fifth order intermodulation product 78, but its passband is smaller.

Those skilled in the art will appreciate that FIG. 6 exaggerates the relative amplitudes for the purpose of teaching aspects of RF transmitter 10 that are relevant to the present invention. Most likely, residually distorted communication signal 74 will exhibit a much greater relative amplitude when compared to third and fifth order intermodulation products 76 and 78 than FIG. 5 suggests. In addition, other higher-ordered, odd intermodulation products, such as the seventh, ninth, and so on, are also present but at such a low level that they are ignored for the purposes of FIG. 6. And, other components within the passband of signal components 74, 76, and 78 are also present but ignored here. For example, second and third order basis functions 60 and 62 are largely counteracted by the nonlinear distortions introduced into the communication signal by HPA 72. But residuals remain in RF communications signal 16 and are passed through the linear term of HPA 72. Such residuals pose no problem due to their low level and to the fact that they are not correlated with baseline communication signal 12 and its downstream counterpart of residually distorted communication signal 74. In the preferred embodiment, the lack of correlation results from the use of orthogonal basis functions.

RF transmitter 10 uses feedback obtained from RF communication signal 16 to control the linear and nonlinear predistortions applied to the communication signal as discussed above so as to minimize the distortions. In particular, a portion of RF communication signal 16 is obtained from a directional coupler 80 located upstream of antenna 18 and routed to an input of a digital-subharmonic-sampling downconverter 82. Downconverter 82 serves as a feedback signal generator and generates feedback signal 20 in response to RF communication signal 16.

Desirably, RF communication signal 16 is routed as directly as possible to downconverter 82 without being processed through analog components that will introduce a significant amount of linear or nonlinear distortion. Such distortions could be mistakenly interpreted by linear and nonlinear predistorters 22 and 24 as being introduced while propagating toward antenna 18 and compensated. Thus, reverse path distortions might possibly have the effect of causing predistorters 22 and 24 to insert distortion that will have no distortion-compensating effect on the actual RF communication signal 16 broadcast from antenna 18 and will actually contribute to an increase in distortion. In a manner understood by those skilled in the art, digital-subharmonic-sampling downconverter 82 simultaneously performs downconversion from RF to baseband with conversion from analog to digital using a digital sampling process that eliminates the types of analog processing that might introduce distortions.

Downconverter 82 includes an analog-to-digital converter (A/D) 84 to perform both the downconversion and analog-to-digital conversion. Desirably, the same local-oscillator signal used by upconverter 68 passes to a synthesizer (not shown) configured to multiply the local-oscillator frequency by four and divide the resulting product by an odd number, characterized as $2N \pm 1$, where N is a positive integer chosen to satisfy the Nyquist criteria for the bandwidth being downconverted, and is usually greater than or equal to ten. In the preferred embodiment, this bandwidth is sufficiently wide to pass at least fifth order intermodulation product 78. The subharmonic sampling process tends to sum thermal noise from several harmonics of the baseband into the resulting baseband signal, thereby increasing noise over other types of downconversion. While these factors pose serious problems in many applications, they are no great burden here because noise is generally uncorrelated with baseline communication signal 12. In addition, downconverter 82 desirably includes demultiplexing and Hilbert transformation functions (not shown) to digitally convert the downconverted signal into a complex baseband signal, which serves as feedback signal 20. Since such functions are performed digitally, no significant distortion is introduced.

Figure 7:
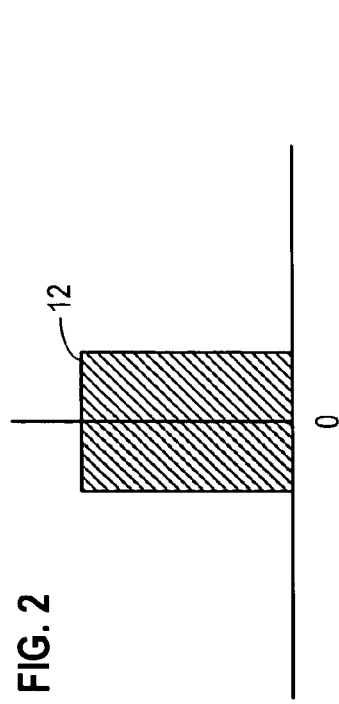
FIG. 7 graphically shows a spectral representation of a feedback signal produced in the RF transmitter of FIG. 1.

FIG. 7 graphically shows a spectral representation of feedback signal 20. Feedback signal 20 resembles RF communication signal 16, but is centered at a frequency of zero. As with RF communication signal 16, feedback signal 20 is characterized by residually distorted communication signal 74 in combination with one or more intermodulation products, such as intermodulation products 76 and 78.

Feedback signal 20 passes from downconverter 82 to a variable phase rotator 86. Variable phase rotator 86 is adjusted to alter the phase of feedback signal 20 primarily to compensate for the phase rotation introduced by BPF 70. As discussed above, baseline communication signal 12 passes to common mode time alignment section 26. Common mode time alignment refers to delay that is inserted equally into both of the in-phase and quadrature-phase legs of the complex communication signal. Section 26 delays baseline communication signal 12 at the output of section 26 to form a delayed version of baseline communication signal 12, depicted in FIG. 1 with the reference number 12'. Baseline communication signal 12' is in temporal alignment with the linear component of feedback signal 20 as presented at the output of phase rotator 86. At these locations baseline communication signal 12 is combined in a combiner 88 with feedback signal 20 to form error signal 54. Desirably, differential mode time alignment section 64, phase rotator 86, and common mode time alignment section 26 are all adjusted so that the correlation between baseline communication signal 12' and the linear component of feedback signal 20 output from phase rotator 86 is maximized.

Baseline communication signal 12' also drives an optional A/D compensation section 92. An output of A/D compensation section 92 is fed back to downconverter 82 to improve the linearity of A/D 84, if necessary.

A conjugator 55 generates a conjugated form 54' of error signal 54. In the preferred embodiment, conjugated error signal 54' is routed to adaptive equalizers 30' and 30" for use in adapting their tap coefficients 34 (FIG. 3). When the delay of section 26 has been determined, a corresponding delay is programmed into delay elements 87 within nonlinear predistorter 24. Basis functions 47 are delayed in delay elements 87 by an amount that places them in temporal alignment with conjugated error signal 54'. Delayed forms 49' and 49" of basis functions 47' and 47", are respectively routed to adaptive equalizers 30' and 30" for use in adapting their tap coefficients 34.

Feedback signal 20 output from phase rotator 86 and baseline communication signal 12' also drive an intermodulation-product canceller 94. In general, intermodulation-product canceller 94 transforms feedback signal 20, referenced by the variable "R" in FIG. 1 to indicate "return", into an intermodulation-neutralized-feedback signal 96, referenced by the variable "R'" in FIG. 1. At least a portion of the intermodulation products present in feedback signal 20, such as intermodulation products 76 and 78 (FIG. 7), are substantially attenuated in intermodulation-neutralized-feedback signal 96 when compared to residually distorted communication signal 74. In other words, the attenuation of such intermodulation products relative to residually distorted communication signal 74 is increased due to the operation of intermodulation-product canceller 94.

Figure 8:
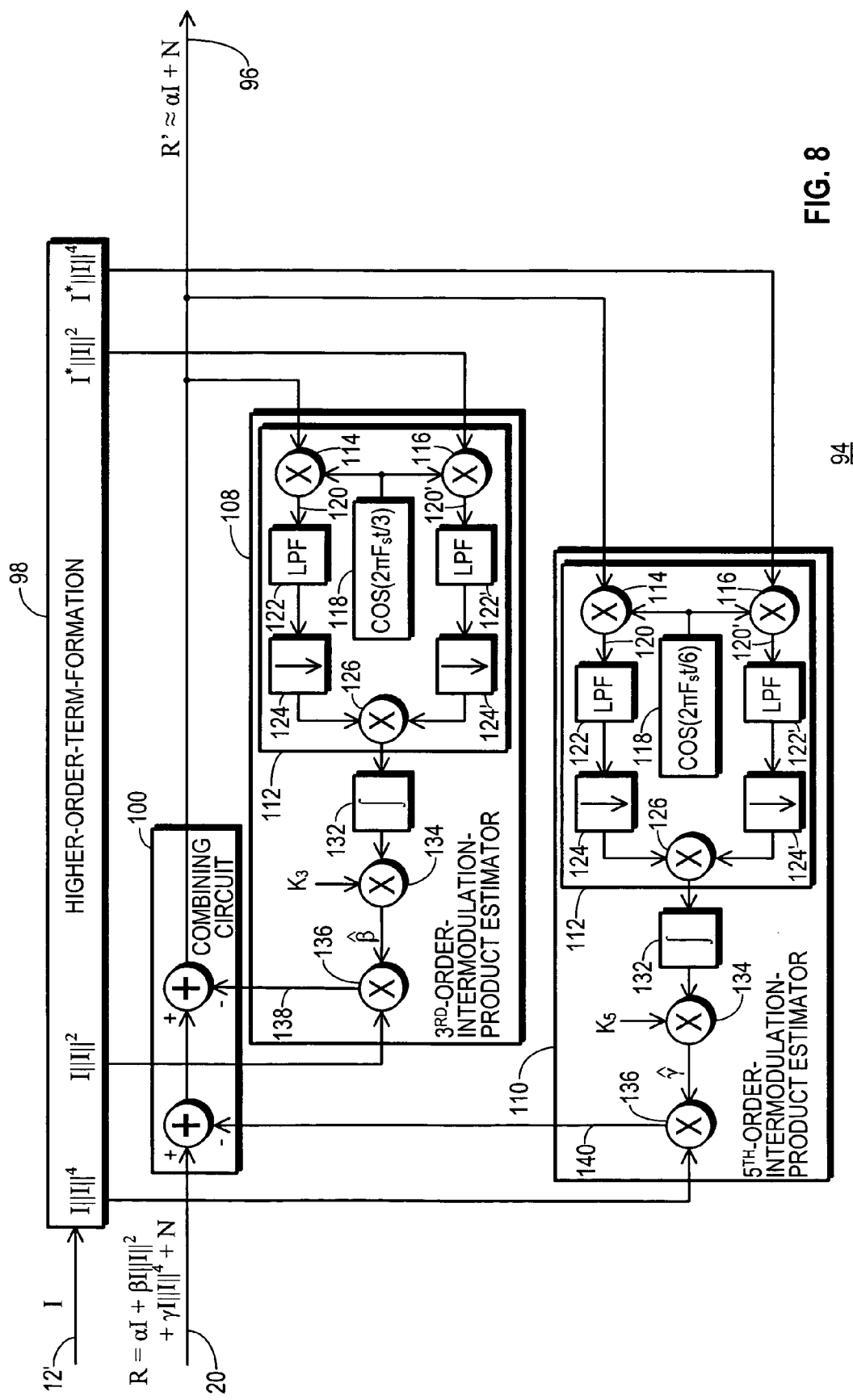
FIG. 8 shows a block diagram of an intermodulation-product canceller used in the RF transmitter of FIG. 1.

FIG. 8 shows a block diagram of one embodiment of intermodulation-product canceller 94. In this embodiment, baseline communication signal 12' is received at a higher-order-term-formation section 98. Baseline communication signal 12' is also referenced in FIG. 8 using the variable "I" to indicate "ideal" because baseline communication signal 12' is deemed to be an ideal, undistorted signal. Higher-order-term-formation section 98 performs the magnitude-determining, conjugating, and multiplying operations that generate the following terms: $I\|I\|^4$, $I\|I\|^2$, $I^*\|I\|^2$, and $I^*\|I\|^4$, where the variable I refers to baseline communication signal 12'.

Feedback signal 20 is received at an input of a combining circuit 100. As depicted in FIG. 8, feedback signal 20 may be characterized as follows:

$$R = \alpha I + \beta I\|I\|^2 + \gamma I\|I\|^4 + N \qquad \text{EQ. 1}$$

where,
R=feedback signal 20,
I=baseline communication signal 12',
$\alpha$, $\beta$, and $\gamma$ represent unknown variables, and
N=noise plus other uncorrelated and low-level signal components.

In EQ. 1, the first order term characterizes residually distorted communication signal 74, the third order term characterizes third order intermodulation product 76, and the fifth order term characterizes fifth order intermodulation product 78.

An output of combining circuit 100 provides intermodulation-neutralized-feedback signal 96. The embodiment of intermodulation-product canceller 94 depicted in FIG. 8 includes two feedback loops which operate to cancel intermodulation products 76 and 78 from feedback signal 20. A third-order-intermodulation-product estimator 108 is driven by intermodulation-neutralized-feedback signal 96 and drives an input of combining circuit 100. A fifth-order-intermodulation-product estimator 110 is driven by intermodulation-neutralized-feedback signal 96 and drives an input of combining circuit 100. Intermodulation-product estimators 108 and 110 are configured similarly to one another.

Estimators 108 and 110 each receive intermodulation-neutralized-feedback signal 96 and a conjugated higher order term from term-formation section 98 at an intermodulation isolator 112. Third-order estimator 108 receives the third order conjugated term from term-formation section 98, and fifth-order estimator 110 receives the fifth order conjugated term from term-formation section 98. Intermodulation isolator 112 operates to isolate each intermodulation product 76 and 78 from the lower ordered intermodulation products and from residually distorted communication signal 74.

Each intermodulation isolator 112 includes a mixer 114 and a mixer 116, with each mixer having first inputs coupled to an output of a signal generator 118. A second input of mixer 114 receives intermodulation-neutralized-feedback signal 96, and a second input of mixer 116 receives the higher order term from term-formation section 98. Signal generator 118 generates an oscillating signal that will downconvert a small frequency band of intermodulation-neutralized-feedback signal 96 to be centered at a frequency of about zero, with the small band being selected to accomplish the above-discussed isolation. Intermodulation band signals 120 and 120' output from multipliers 114 and 116 are respectively filtered in low-pass filters (LPF) 122 and 122', then decimated in decimators 124 and 124', respectfully. Next, correlation between intermodulation band signals 120 and 120' is measured in a multiplier 126. An output of multiplier 126 serves as the output from intermodulation isolator 112.

With reference to FIGS. 7 and 8, for third-order-intermodulation-product estimator 108 signal generator 118 generates a signal oscillating at a frequency which causes mixers 114 and 116 to downconvert their respective signals within an intermodulation band 128 to a frequency centered approximately at zero. All energy outside of intermodulation band 128 is greatly attenuated in LPF's 122 and 122', and decimators 124 and 124' reduce the sampling rate to a rate consistent with the bandwidth of LPF's 122 and 122'. Intermodulation band 128 is selected to measure energy primarily from third order intermodulation product 76 and coincidentally from fifth order intermodulation product 78, but not from residually distorted communication signal 74.

For fifth-order-intermodulation-product estimator 110 signal generator 118 generates a signal oscillating at a frequency which causes mixers 114 and 116 to downconvert their respective signals within an intermodulation band 130 to a frequency centered approximately at zero. All energy outside of intermodulation band 130 is greatly attenuated in LPF's 122 and 122', and decimators 124 and 124' reduce the sampling rate to a rate consistent with the bandwidth of LPF's 122 and 122'. Intermodulation band 130 is selected to measure energy from fifth order intermodulation product 78, but not from third order intermodulation product 76 or from residually distorted communication signal 74.

The outputs from multipliers 126 indicate, on an instant by instant basis, the degree of correlation in the energy from the selected intermodulation band 128 or 130 between a higher ordered basis signal and intermodulation-neutralized-feedback signal 96, where the higher ordered basis signal is formed from baseline communication signal 12. These instant by instant correlation measurements are integrated in an integrator 132, and the result scaled in a multiplier 134 by a loop constant. The resultant scaled signal is then multiplied by the respective higher ordered basis function from term formation section 98, and subtracted from feedback signal 20 in combining circuit 100.

For third-order intermodulation-product estimator 108, multiplier 134 multiplies the integrated signal by a constant $K_3$, the output of multiplier 134 provides an estimate of the variable $\beta$, discussed above, and multiplier 136 multiplies the estimate of $\beta$ by the third-order term from term formation section 98. The output from multiplier 136 generates a third-order-intermodulation-estimate signal 138 that is subtracted in combining circuit 100 from feedback signal 20.

For fifth-order intermodulation-product estimator 110, multiplier 134 multiplies the integrated signal by a constant $K_5$, the output of multiplier 134 provides an estimate of the variable $\gamma$, discussed above, and multiplier 136 multiplies the estimate of $\gamma$ by the fifth-order term from term formation section 98. The output from multiplier 136 generates a fifth-order-intermodulation-estimate signal 140 that is subtracted in combining circuit 100 from feedback signal 20.

Integrators 132 in the respective intermodulation-product estimators 108 and 110 integrate to a point where the respective intermodulation-estimate signal 138 or 140 cancels the respective intermodulation product 76 or 78 as best it can. From this steady-state point, if the intermodulation-estimate signal 138 or 140 becomes too strong for the current level of the respective intermodulation product in feedback signal 20, integrator 132 will drift in a direction that reduces the corresponding intermodulation-estimate signal 138 or 140, and vice-versa.

Accordingly, intermodulation-estimate signals 138 and 140 are formed from baseline communication signal 12, and they are configured to respectively cancel third and fifth order intermodulation products 76 and 78 that appear in RF communication signal 16 and in feedback signal 20. Each of intermodulation-estimate signals 138 and 140 is also formed in response to the operation of an intermodulation isolator 112 that provides a measurement which is more responsive to the energy from at least one of intermodulation products 76 and 78 than from residually distorted communication signal 74. Intermodulation-neutralized-feedback signal 96 forms as a result of the cancellation operations that takes place in combining circuit 100. Intermodulation-neutralized-feedback signal 96 exhibits the following form:

$$R' \approx \alpha I + N \qquad \text{EQ.2}$$

where,

R'=intermodulation-neutralized-feedback signal 96

I=baseline communication signal 12', $\alpha$, represents an unknown variable, and N=noise plus other uncorrelated and low-level signal components.

Figure 9:
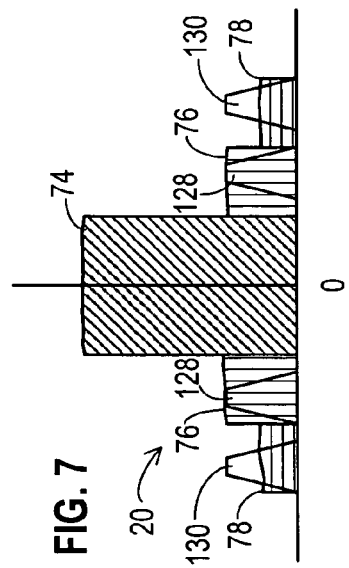
FIG. 9 graphically shows a spectral representation of an intermodulation-neutralized-feedback signal produced in the RF transmitter of FIG. 1.

FIG. 9 graphically shows a spectral representation of intermodulation-neutralized-feedback signal 96. At least a portion of the intermodulation products have been greatly attenuated, but residually distorted communication signal 74 remains.

Referring back to FIG. 1, intermodulation-neutralized-feedback signal 96 is subtracted from baseline communication signal 12' in a combining circuit 142 to form error signal 36. Error signal 36 then passes through a low-pass filter (LPF) 144, a decimator 146, and a conjugator 148. LPF 144 and decimator 146 together reduce the sampling rate of intermodulation-neutralized-feedback signal 96 to a slower rate consistent with the operation of adaptive equalizer 30 (FIG. 1). Conjugator 148 produces the conjugated form 36' of error signal 36 that is used, along with baseline communication signal 12' in adapting tap coefficients 34 in the adaptive equalizer 30 that serves as linear predistorter 22. Since intermodulation products 76 and 78 have been removed from intermodulation-neutralized-feedback signal 96 and hence also from error signals 36 and 36', they do not interfere with the tap coefficient adaptation algorithm.

While noise term "N" from EQ. 2 is still present in error signal 36, it poses no problem. To the extent that a portion of the noise term is uncorrelated with baseline communication signal 12, it will exert no influence over the tap coefficient adaptation algorithm. To the extent that a portion of the noise term is correlated with baseline communication signal 12, such as seventh and ninth order intermodulation products, the amplitudes of such terms are so exceedingly low that the leaky tap LMS algorithm mitigates all regenerative feedback conditions which might otherwise develop.

In contrast to the adaptation of tap coefficients for linear predistorter 22, the adaptation of tap coefficients for nonlinear predistorter 24 continues to be responsive to intermodulation products 76 and 78. By monitoring intermodulation products 76 and 78, nonlinear predistorter 24 is able to maintain intermodulation products 76 and 78 at a minimum level in RF communication signal 16. Accordingly, intermodulation-product canceller 94 isolates nonlinear predistorter 24 from intermodulation-neutralized-feedback signal 96. In some operating circumstances, it may be advantageous to employ intermodulation cancellation processing to eliminate specific intermodulation components from the return signal paths 54 of some or all of the nonlinear equalizers, thus permitting individual nonlinear equalizers to focus on reducing specific sets of nonlinear intermodulation signals.

Figure 10:
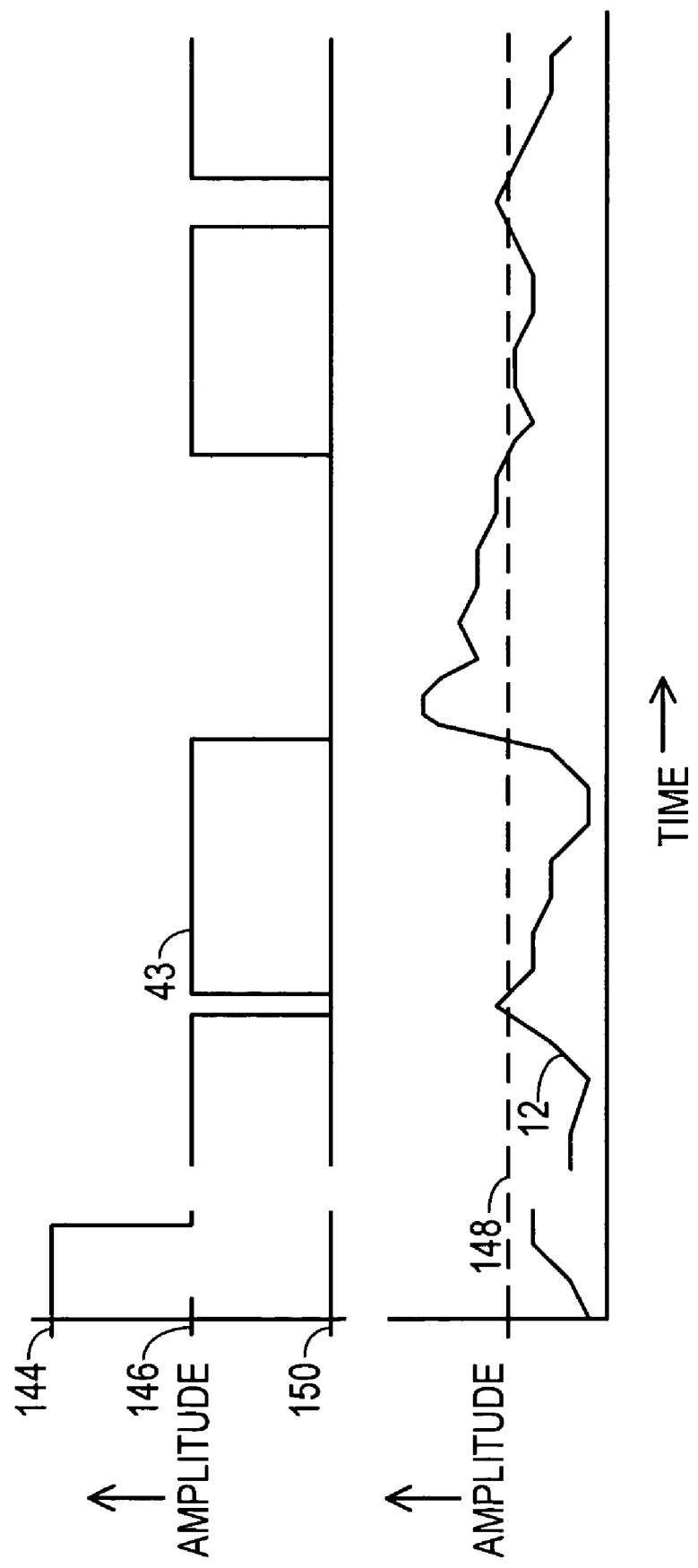
FIG. 10 graphically shows modulation of a convergence factor applied to a linear predistorter portion of the RF transmitter of FIG. 1.

FIG. 10 graphically shows modulation of convergence factor 43 ("$\mu$"), which is applied to the adaptive equalizer 30 that serves as linear predistorter 22. Referring to FIGS. 1, 3, and 10, the leftmost side of FIG. 10 shows that convergence factor 43 may be initiated at a faster convergence/higher jitter setting 144 when RF transmitter 10 is first initialized, then adjusted toward a slower convergence/lower jitter setting, labeled steady-state setting 146, as RF transmitter 10 becomes operational.

During the steady-state operation of RF transmitter 10, control section 45 is desirably configured to monitor the amplitude of baseline communication signal 12 in one embodiment. But the monitoring of baseline communication 12 itself is not critical. Control section 45 may alternatively monitor any of baseline communication signal 12, predistorted communication signal 28, RF communication signal 16, feedback signal 20, intermodulation-neutralized-feedback signal 96 or variants thereof because all these signals are highly correlated with one another with respect to the parameter of signal amplitude.

FIG. 10 also shows an exemplary representation of the amplitude of communication 12. Control section 45 desirably compares this amplitude of communication 12 to an amplitude threshold 148, and when the amplitude exceeds threshold 148 causes convergence factor 43 to exhibit a very low level 150 (i.e. an even slower convergence/even lower jitter setting), and perhaps zero (i.e., adaptation turned off). As soon as the amplitude of communication signal 12 drops below threshold 148 convergence factor 43 is returned to steady state level 146.

As indicated by a dotted line connection of convergence factor 43 to leaky integrators 46 in FIG. 3, the offset which is subtracted from the integrator value in leaky integrators 46 during each clock cycle is desirably proportional or otherwise responsive to convergence factor 43. Thus, when convergence factor 43 exhibits zero, coefficients 34 are frozen. But when convergence factor 43 is not zero, coefficients 34 are allowed to leak toward zero when the LMS update algorithm does not override the leakage offset.

Amplitude threshold 148 is desirably set at a signal level for communication signal 12 which corresponds to an amplitude where HPA 72 (FIG. 1) begins to generate significant amounts of nonlinear energy. When communication signal 12 is above this threshold amplitude 148, HPA 72 is more likely to produce larger amounts of nonlinear energy, including the higher-ordered intermodulation products. By effectively freezing linear adaptation in adaptive equalizer 30 during such situations, linear predistorter 22 is less likely to drift away from a more optimal setting in an initial attempt to reduce some of the larger amounts of nonlinear energy. In such situations nonlinear predistorter 24 is free to adapt as needed to address the larger amounts of nonlinear energy. As a consequence of restricting the ability of linear predistorter 22 from drifting away from what is likely to be an optimum setting that presents a nearly ideal, undistorted communication signal to HPA 72, nonlinear energy may be driven to a lower level than if linear predistorter 22 where permitted to drift more freely.

In the preferred embodiment, intermodulation-product canceller 94 operates in conjunction with the modulation of convergence factor 43 to substantially prevent correlated nonlinear energy from inducing unwanted biases in tap coefficients 34. But alternate embodiments may rely exclusively on either of intermodulation-product canceller 94, or the modulation of convergence factor 43 to prevent unwanted biases in different applications. And, while FIG. 10 shows that convergence factor 43 may change abruptly between steady state level 146 and lower level 150 when threshold 148 is reached, other modulation functions may also be applied. For example, rather than relying on a comparison with amplitude threshold 148, convergence factor 43 may be modulated to be inversely proportional to the amplitude of communication signal 12, or the variants thereof.

In summary, the present invention provides an improved RF transmitter with predistortion and a method therefor. In at least one embodiment of the present invention a feedback loop that controls linear predistortion is prevented from becoming inaccurate, and possibly unstable, at least in part because intermodulation products are attenuated in a feedback signal used by an RF transmitter to adjust tap coefficients in an adaptive equalizer that serves as a linear predistorter. In at least one embodiment of the present invention, signal cancellation is used to remove intermodulation products from a feedback signal. In at least one embodiment of the present invention, a baseline communication signal is used to form an intermodulation-estimate signal that, when combined with a feedback signal, cancels an intermodulation product. And, in at least one embodiment of the present invention a nonlinear predistorter adjusts tap coefficients in response to intermodulation products but a linear predistorter is insensitive to intermodulation products.

Although the preferred embodiments of the invention have been illustrated and described in detail, it will be readily apparent to those skilled in the art that various modifications may be made therein without departing from the spirit of the invention or from the scope of the appended claims. For example, no requirement exists that orthogonal basis functions be used in basis function generation section 48. But when basis functions are not orthogonal, additional feedback loops may been needed to cancel other terms along the lines discussed above in connection with FIG. 8. For example, intermodulation-product canceller 94 may include an additional feedback loop to cancel the residual energy remaining in RF communication signal 16 and feedback signal 20 from the linear amplification of second-order basis functions. And, still other feedback loops may be used to cancel higher ordered terms from feedback signal 20 prior to using feedback signal 20 to drive the tap coefficient adaptation algorithms for adaptive equalizers used by nonlinear predistorter 24. In another alternate embodiment, intermodulation-product canceller 94 can remove interfering intermodulation products from error signal 36 rather than from feedback signal 20. In other words, combining circuit 142 may be placed ahead of intermodulation-product canceller 94 rather than behind it. In yet another alternate embodiment, feedback loops need not be employed to form intermodulation-estimate signals 138 and 140. Rather, the estimates of the variables $\beta$ and $\gamma$ from EQ. 1 may be directly calculated by mathematical manipulation of baseline communication signal 12' and feedback signal 20 and by solving a system of linear equations. These and other modifications and adaptations which are obvious to those skilled in the art are to be included within the scope of the present invention.

What is claimed is:

1. A radio-frequency (RF) transmitter with predistortion, said RF transmitter comprising:
   an adaptive equalizer configured to predistort a baseline communication signal into a predistorted communication signal and to adjust tap coefficients of said adaptive equalizer, said tap coefficients defining how to predistort said baseline communication signal;
   a power amplifier located downstream of said adaptive equalizer and configured to generate an RF communication signal which carries a residually distorted communication signal and intermodulation products thereof;
   a feedback signal generator configured to generate a feedback signal in response to said RF communication signal, said feedback signal being characterized by said residually distorted communication signal in combination with one or more of said intermodulation products; and
   an intermodulation-product canceller adapted to generate an intermodulation-neutralized-feedback signal from said feedback signal, said intermodulation-neutralized-feedback signal being supplied to said adaptive equalizer so that said tap coefficients adapt in response to said intermodulation-neutralized-feedback signal.

2. An RF transmitter as claimed in claim 1 wherein said intermodulation-product canceller is configured to attenuate at least a portion of said intermodulation products relative to said residually distorted communication signal in said intermodulation-neutralized-feedback signal.

3. An RF transmitter as claimed in claim 1 wherein said tap coefficients also adapt in response to said baseline communication signal.

4. An RF transmitter as claimed in claim 1 wherein:
said tap coefficients adapt in response to a product of said baseline communication signal and an error signal; and
said error signal is responsive to a difference between said baseline communication signal and said feedback signal.

5. An RF transmitter as claimed in claim 1 wherein:
said adaptive equalizer is configured as a linear predistorter; and
said RF transmitter additionally comprises a nonlinear predistorter responsive to said baseline communication signal and coupled to said linear predistorter.

6. An RF transmitter as claimed in claim 5 wherein:
said nonlinear predistorter includes an adaptive equalizer having tap coefficients which adapt in response to said feedback signal; and
said intermodulation-product canceller isolates said nonlinear predistorter from said intermodulation-neutralized-feedback signal.

7. An RF transmitter as claimed in claim 1 wherein said tap coefficients of said adaptive equalizer also adapt in accordance with a leaky-tap algorithm.

8. An RF transmitter as claimed in claim 1 wherein said intermodulation-product canceller comprises:
a third-order-intermodulation-product estimator configured to generate a third-order-intermodulation-estimate signal; and
a combining circuit having inputs adapted to receive said feedback signal and said third-order-intermodulation-estimate signal and to produce said intermodulation-neutralized-feedback signal to be responsive to a difference between said feedback signal and said third-order-intermodulation-estimate signal.

9. An RF transmitter as claimed in claim 8 wherein:
said intermodulation-product canceller additionally comprises a fifth-order-intermodulation-product estimator configured to generate a fifth-order-intermodulation-estimate signal; and
said combining circuit is further adapted to receive said fifth-order-intermodulation-estimate signal and to cause said intermodulation-neutralized-feedback signal to be responsive to said fifth-order-intermodulation-estimate signal.

10. An RF transmitter as claimed in claim 8 wherein said third-order-intermodulation-estimate signal is formed from said baseline communication signal.

11. An RF transmitter as claimed in claim 8 wherein said third-order-intermodulation-product estimator forms a portion of a feedback loop that adjusts said third-order-intermodulation-estimate signal to minimize a third-order-intermodulation product portion of said intermodulation-neutralized-feedback signal.

12. An RF transmitter as claimed in claim 11 wherein said third-order-intermodulation-product estimator comprises a intermodulation isolator configured to provide a measurement which is more responsive to energy from said third-order intermodulation product than from said residually distorted communication signal.

13. An RF transmitter as claimed in claim 1 wherein said feedback signal generator comprises a digital-subharmonic-sampling downconverter.

14. An RF transmitter as claimed in claim 1 additionally comprising a control section configured to generate a convergence factor in response to an amplitude exhibited by at least one of said baseline communication signal, said predistorted communication signal, RF communication signal, and said intermodulation-neutralized-feedback signal, said convergence factor being supplied to said adaptive equalizer so that said adaptive equalizer adjusts said tap coefficients in response to said convergence factor.

15. A method of operating a radio-frequency (RF) transmitter, said method comprising:
filtering a baseline communication signal in an adaptive equalizer having adaptable tap coefficients to form a predistorted communication signal;
generating an RF communication signal which carries a residually distorted communication signal and at least a third-order intermodulation product in response to said predistorted communication signal;
attenuating said third-order intermodulation product relative to said residually distorted communication signal from said RF communication signal to produce an intermodulation-neutralized-feedback signal; and
adapting said tap coefficients of said adaptive equalizer in response to said intermodulation-neutralized-feedback signal.

16. A method as claimed in claim 15 wherein said attenuating step comprises the step of cancelling said third-order intermodulation product from said RF communication signal to produce said intermodulation-neutralized-feedback signal.

17. A method as claimed in claim 15 wherein said adapting step also adapts said tap coefficients in response to said baseline communication signal.

18. A method as claimed in claim 15 wherein:
said tap coefficients adapt in response to a product of said baseline communication signal and an error signal; and
said error signal is responsive to differences between said baseline communication signal and said intermodulation-neutralized-feedback signal.

19. A method as claimed in claim 15 wherein said adaptive equalizer is configured as a linear predistorter, and said method additionally comprises applying nonlinear predistortion to one of said baseline communication signal and said predistorted communication signal.

20. A method as claimed in claim 19 wherein:
said applying step applies said nonlinear predistortion using an adaptive equalizer having tap coefficients which adapt in response to said RF communication signal; and
said method additionally comprises isolating said intermodulation-neutralized-feedback signal from said adaptive equalizer that applies said nonlinear predistortion.

21. A method as claimed in claim 15 wherein said attenuating step comprises:
forming a feedback signal in response to said RF communication signal, said feedback signal being characterized by said residually distorted communication signal in combination with one or more of said intermodulation products;
forming a third-order-intermodulation-estimate signal; and
combining said feedback signal and said third-order-intermodulation-estimate signal.

22. A method as claimed in claim 21 wherein said third-order-intermodulation-estimate signal is formed from said baseline communication signal.

23. A method as claimed in claim 15 additionally comprising adjusting said third-order-intermodulation-estimate signal in a feedback loop to minimize a third-order-intermodulation product portion of said intermodulation-neutralized-feedback signal.

24. A method as claimed in claim 23 additionally comprising providing a measurement from said intermodulation-neutralized-feedback signal which is more responsive to energy from said third-order intermodulation product than from said residually distorted communication signal.

25. A method as claimed in claim 15 wherein:
said adapting step additionally adapts said tap coefficients of said adaptive equalizer in response to a convergence factor; and
said method additionally comprises modulating said convergence factor in response to an amplitude exhibited by at least one of said baseline communication signal, said predistorted communication signal, RF communication signal, and said intermodulation-neutralized-feedback signal.

26. A method as claimed in claim 25 wherein said modulating step is configured to cause faster convergence at a lower amplitude and to cause slower convergence at a higher amplitude.

27. A method of operating a radio-frequency (RF) transmitter, said method comprising:
filtering a baseline communication signal in an adaptive equalizer having adaptable tap coefficients to form a predistorted communication signal;
producing an intermodulation-neutralized-feedback signal from which intermodulation products have been cancelled; and
adjusting said tap coefficients in response to said intermodulation-neutralized-feedback signal.

28. A method as claimed in claim 27 additionally comprising:
generating, in response to said predistorted communication signal, an RF communication signal which carries a residually distorted communication signal and intermodulation products; and
generating, from said RF communication signal, a feedback signal which is characterized by said residually distorted communication signal and at least a portion of said intermodulation products.

29. A method as claimed in claim 28 wherein said feedback-signal generating step comprises downconverting said RF communication signal using a digital-subharmonic-sampling downconverter.

30. A method as claimed in claim 28 wherein said producing step comprises
forming an intermodulation-estimate signal; and
combining said feedback signal and said intermodulation-estimate signal to produce said intermodulation-neutralized-feedback signal.

31. A method as claimed in claim 30 wherein said forming step forms said intermodulation-estimate signal from said baseline communication signal.

32. A method as claimed in claim 31 additionally comprising adjusting said intermodulation-estimate signal in a feedback loop to minimize an intermodulation product portion of said intermodulation-neutralized-feedback signal.

33. A method as claimed in claim 32 additionally comprising providing a measurement from said intermodulation-neutralized-feedback signal which is more responsive to energy from said intermodulation product than from said residually distorted communication signal.

34. A method as claimed in claim 27 wherein:
said adjusting step additionally adjusts said tap coefficients of said adaptive equalizer in response to a convergence factor; and
said method additionally comprises modulating said convergence factor in response to an amplitude exhibited by at least one of said baseline communication signal, said predistorted communication signal, and said intermodulation-neutralized-feedback signal to achieve faster convergence at a lower amplitude and slower convergence at a higher amplitude.

35. A method of operating a radio-frequency (RF) transmitter, said method comprising:
filtering a baseline communication signal in an adaptive equalizer having adaptable tap coefficients to form a predistorted communication signal;
generating a feedback signal in response to said predistorted communication signal;
adjusting said tap coefficients in response to said feedback signal and in response to a convergence factor; and
modulating said convergence factor in response to an amplitude exhibited by at least one of said baseline communication signal, said predistorted communication signal and said feedback signal.

36. A method as claimed in claim 35 wherein said modulating step is configured to cause faster convergence at a lower amplitude and to cause slower convergence at a higher amplitude.

37. A method as claimed in claim 35 wherein:
said method additionally comprises producing an intermodulation-neutralized-feedback signal from which intermodulation products have been cancelled, said intermodulation-neutralized-feedback signal being produced from said feedback signal; and
said adjusting step adjusts said tap coefficients in response to said intermodulation-neutralized-feedback signal and in response to said convergence factor.

38. A method as claimed in claim 37 wherein:
said method additionally comprises generating, in response to said predistorted communication signal, an RF communication signal which carries a residually distorted communication signal and intermodulation products; and
said feedback signal is characterized by said residually distorted communication signal and at least a portion of said intermodulation products.

39. A method as claimed in claim 37 wherein said producing step comprises:
forming an intermodulation-estimate signal; and
combining said feedback signal and said intermodulation-estimate signal to produce said intermodulation-neutralized-feedback signal.

40. A method as claimed in claim 35 wherein:
said method additionally comprises generating, in response to said predistorted communication signal, an RF communication signal which carries a residually distorted communication signal and intermodulation products; and
said feedback-signal generating step comprises downconverting said RF communication signal using a digital-subharmonic-sampling downconverter.

* * * * *